(12) United States Patent
Kruip et al.

(10) Patent No.: US 8,228,147 B2
(45) Date of Patent: Jul. 24, 2012

(54) SUPPORTED SUPERCONDUCTING MAGNET

(75) Inventors: Marcel Kruip, Oxford (GB); Nicholas Mann, Compton (GB)

(73) Assignee: Siemens Plc, Frimley, Camberley (GB)

( * ) Notice: Subject to any disclaimer, the term of this patent is extended or adjusted under 35 U.S.C. 154(b) by 159 days.

(21) Appl. No.: 12/304,088

(22) PCT Filed: Sep. 6, 2007

(86) PCT No.: PCT/GB2007/050525
§ 371 (c)(1),
(2), (4) Date: Jun. 24, 2010

(87) PCT Pub. No.: WO2008/032110
PCT Pub. Date: Mar. 20, 2008

(65) Prior Publication Data
US 2010/0265018 A1    Oct. 21, 2010

(30) Foreign Application Priority Data
Sep. 15, 2006 (GB) .................... 0618107.7

(51) Int. Cl.
H01F 1/00 (2006.01)
H01F 6/00 (2006.01)
(52) U.S. Cl. .................. 335/216; 335/296; 324/315
(58) Field of Classification Search .......... 335/216, 335/296–299; 324/318
See application file for complete search history.

(56) References Cited

U.S. PATENT DOCUMENTS

| | | | |
|---|---|---|---|
| 3,781,733 A | 12/1973 | Heim | |
| 4,696,169 A | 9/1987 | Niemann et al. | |
| 4,986,078 A | 1/1991 | Laskaris | |
| 5,176,001 A * | 1/1993 | Taylor et al. | 62/45.1 |
| 5,530,413 A | 6/1996 | Minas et al. | |
| 6,002,315 A | 12/1999 | Heiberger et al. | |
| 6,181,228 B1 * | 1/2001 | Laskaris et al. | 335/300 |
| 6,198,371 B1 * | 3/2001 | Laskaris et al. | 335/299 |
| 6,358,583 B1 | 3/2002 | Nagendra et al. | |
| 7,382,134 B2 * | 6/2008 | Matsumoto | 324/319 |
| 2006/0290351 A1 | 12/2006 | Matsumoto | |
| 2008/0022698 A1 * | 1/2008 | Hobbs et al. | 62/51.1 |
| 2009/0273348 A1 * | 11/2009 | Tigwell | 324/318 |

FOREIGN PATENT DOCUMENTS

| | | |
|---|---|---|
| EP | 0 118 807 A2 | 9/1984 |
| EP | 0 414 443 A1 | 2/1991 |
| EP | 0 457 285 A2 | 11/1991 |

(Continued)

OTHER PUBLICATIONS

International Search Report dated Jan. 18, 2008 (Three (3) pages).

(Continued)

*Primary Examiner* — Bernard Rojas
(74) *Attorney, Agent, or Firm* — Crowell & Moring LLP

(57) ABSTRACT

A supported superconducting magnet, comprising a superconducting magnet arranged within an outer vacuum container; and a support structure bearing the weight of the superconducting magnet against a support surface. The support structure comprises a tubular suspension element located between the magnet and the support surface, said tubular suspension element retaining the magnet in a fixed relative position with reference to the outer vacuum container by means of complementary interface surfaces arranged to transmit the weight of the superconducting magnet to the support structure. The tubular suspension element is arranged about a generally vertical axis, and supports a solenoidal magnet structure which is arranged about a generally horizontal axis.

11 Claims, 4 Drawing Sheets

FOREIGN PATENT DOCUMENTS

| | | |
|---|---|---|
| EP | 1 001 438 A1 | 5/2000 |
| GB | 2 207 813 A | 2/1989 |
| GB | 2 329 699 A | 3/1999 |
| GB | 2 396 255 A | 6/2004 |
| JP | 61-231705 A | 10/1986 |
| JP | 3-85701 A | 4/1991 |

OTHER PUBLICATIONS

PCT/ISA/237 (Eight (8) pages).

European Office Action dated Dec. 27, 2006 (Five (5) pages).

* cited by examiner

PRIOR ART

SUPPORTED SUPERCONDUCTING MAGNET

BACKGROUND OF THE INVENTION

In order to maintain the necessary cryogenic temperature, superconducting magnets such as those used in MRI scanners must be suspended inside a vacuum vessel. In order to fully constrain the suspended vessel under the loads encountered during operation and transportation, conventional designs employ multiple suspension elements. These elements are complicated and require multiple attachments to the vessels. The result is an expensive suspension system which is time consuming to assemble and not well suited to volume production conditions.

FIG. 1 illustrates a cross-sectional view of a conventional solenoidal magnet arrangement for a nuclear magnetic resonance (NMR) or magnetic resonance imaging (MRI) system. A number of coils of superconducting wire are wound onto a former 1. The resulting assembly is housed inside a cryogen vessel 2 which is at least partly filled with a liquid cryogen 2a at its boiling point. The coils are thereby held at a temperature below their critical point.

Also illustrated in FIG. 1 are an outer vacuum container 4 and thermal shield 3. As is well known, these serve to thermally isolate the cryogen vessel 2, typically containing a liquid cryogen 2a, from the surrounding atmosphere. Solid insulation 5 may be placed inside the space between the outer vacuum container 4 and the thermal shield 3. A central bore 4a is provided, of a certain dimension to allow access for a patient or other subject to be imaged.

Conventionally, a number of supporting elements 7 are connected between the cryogen vessel 2 and the outer vacuum container 4 to bear the weight of the cryogen vessel. These may be tensile bands, tensile rods, straps, compression struts or any known element suitable for the purpose. The elements should have a very low thermal conductivity, in the case that a cryogen vessel is supported. This is important in order to minimise heat influx from the outer vacuum container 4, which is typically at ambient temperature, to the cryogen vessel 2. The suspension elements typically pass through holes in the thermal shield 3 and the insulation 5. Similar, or alternative, suspension arrangements may be provided to retain the thermal shield 3.

The suspension elements must be of the minimum cross sectional area and maximum length in order to minimise the heat flow into the magnet. In conventional designs such as shown in FIG. 1, multiple tension-only elements or combinations of tension and compression elements are employed. These may be made from high strength steel or advanced composite materials using glass, carbon or other suitable load-bearing fibres. Typically a minimum of eight elements are used for each vessel, giving a total of sixteen elements to support a typical magnet and radiation shield system. Such a system will typically contain hundreds of individual parts, which must be individually assembled. Since MRI systems are commonly transported fully assembled and filled with cryogen, the suspension must be capable of resisting the high loads associated with transportation and handling. The suspended vessels must be accurately constrained at all times, and when conventional elements are used this requires that the elements are pre-loaded to ensure than they remain tight under all the foreseeable design loads. Due to the need to achieve the smallest overall system dimensions, space for the suspension is limited, and access is further restricted by the insulation blankets that must be used. Each suspension element passes through holes in the thermal shield 3 and the insulation 5. These holes must be sealed during assembly, once the suspension elements are in place, to maintain effective thermal insulation and shielding. As a result, the assembly procedure is complicated and time consuming, and not well suited to high volume manufacture.

EP 1001438 describes a tube suspension arrangement for use in a superconducting magnet, wherein the cryogenic vessel may move relative to the thermal shield and the OVC during cool down from ambient temperature to cryogenic temperature.

U.S. Pat. No. 6,358,583 describes an arrangement wherein a magnet structure is supported on a thermal shield by a first tubular support, the thermal shield being supported on the OVC by a second tubular support.

U.S. Pat. No. 5,530,413 describes a cooled solenoid magnet in a cryostat arrangement, wherein the magnet and thermal shield are supported by tubular support structures coaxial with the solenoidal magnet.

SUMMARY OF THE INVENTION

The present invention provides a supported superconducting magnet having a substantially horizontal axis, in which the multiple suspension elements of conventional arrangements are replaced by a single support element arranged about a substantially vertical axis, substantially perpendicular to the axis of the magnet. The support element is preferably capable of resisting foreseeable loads in the directions of all anticipated forces to be experienced by the magnet, and is arranged to have the appropriate strength in appropriate directions such as tension, compression and torsion. As a result, complexity of the suspension arrangement is substantially reduced, since a reduced number of components are required, there is no need to provide, or seal holes in the thermal shield and insulation to allow suspension elements to pass through, and no pre-loading is required. The assembly process is accordingly significantly simplified.

The present invention accordingly provides methods and apparatus as defined in the appended claims.

BRIEF DESCRIPTION OF THE DRAWING FIGURES

The above, and further, objects, aims and characteristics of the present invention will become more apparent from the following description of certain embodiments thereof, in conjunction with the following drawings, wherein.

DETAILED DESCRIPTION

Figure 2:
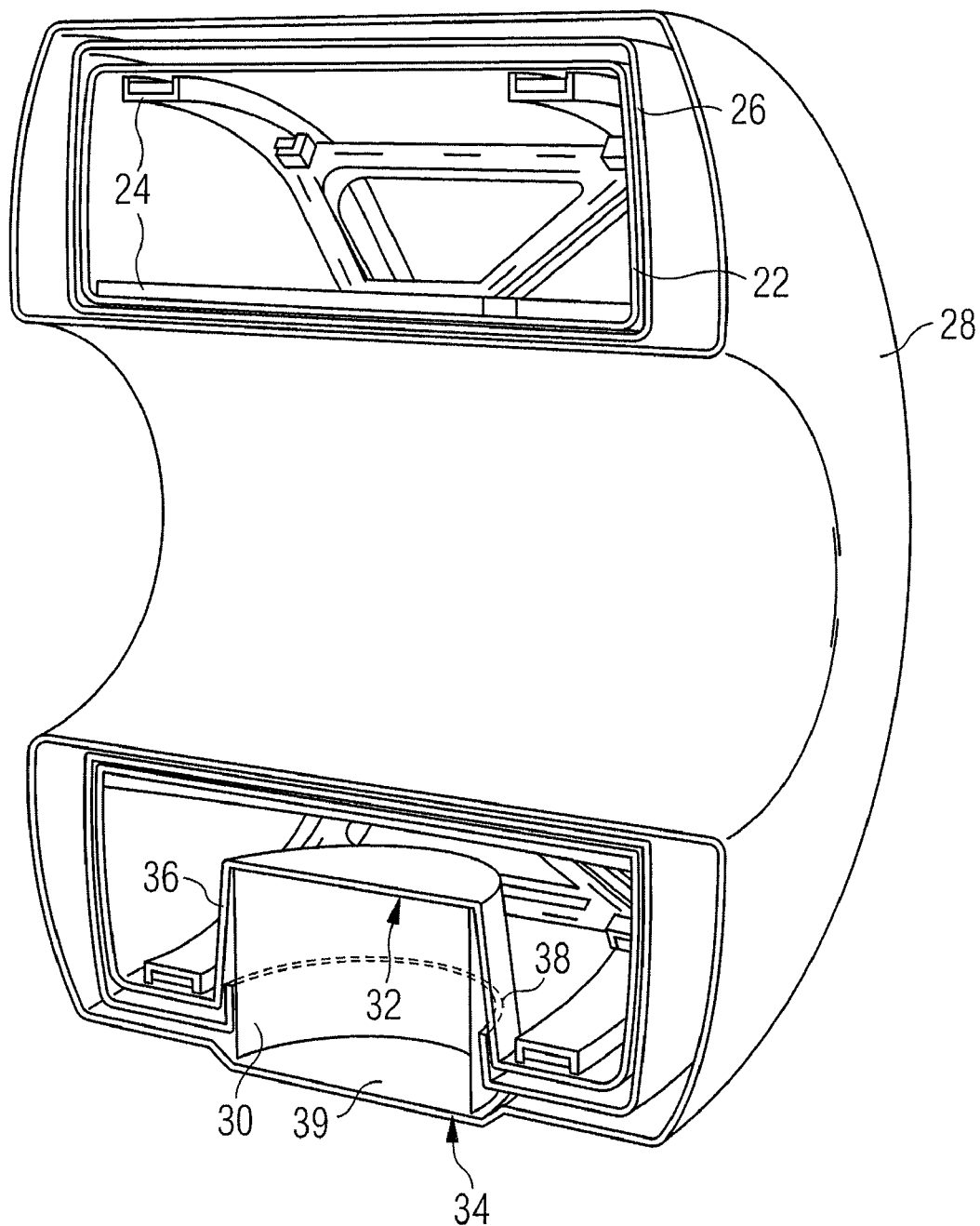
FIG. 2 shows a suspension system according to an embodiment of the present invention.

An embodiment of a suspension system according to the present invention is shown in FIG. 2. A generally tubular vessel 22 (the "cryogen vessel") containing superconducting magnet coils 24 is supported by a support arrangement, bearing on a support surface, such as a floor. The cryogen vessel 22 is surrounded by a close fitting thermal radiation shield 26, and the whole assembly is contained within an outer vacuum container ("OVC") 28. A single, generally tubular, support element 30 at one end 32 contacts the cryogen vessel 22 by way of appropriate interface means, and provides floor mounting of the system at the other end 34. The OVC 28 is attached to the tubular suspension element at or near the floor end 34. A re-entrant section 36 is provided in the cryogen vessel 22 to provide space for the tubular support element 30 without increasing the overall system height from the floor by partially accommodating the tubular support element 30 within the re-entrant section. This is made possible by the arrangement of magnet coils 24. This arrangement of magnet coils is conventional in itself, consisting essentially of a number of primary coils of similar radius, with shield coils of significantly larger radius located at or near either end of the primary coils. The tubular support element supports and retains the cryogen vessel whose weight bears on the tubular support element through complementary interface surfaces on the tubular support element 30 and the cryogen vessel 22. In the simplest arrangement, the complementary surfaces comprise a cross-section through the support element 30, perpendicular to its axis, and a planar surface at the end 32 of the re-entrant portion 36 of the cryogen vessel 22.

The thermal radiation shield 26 is preferably similarly supported from a flange 38 positioned part way up the tubular support element 30. The tubular support element may serve to retain the thermal radiation shield 26 in a fixed position with reference to the outer vacuum container 28 and the cryogen vessel 22 by means of complementary interface surfaces 38 arranged to transmit the weight of the shield to the tubular support element.

In order to achieve the required strength and thermal properties of a support system, yet in a compact configuration, the tubular support element 30 is preferably manufactured from one or more composite material composed of glass fibre, carbon fibre or other high performance fibres held in a suitable matrix material such as epoxy or similar resin. Using such materials, the orientation of the fibres can be optimised to provide the required combination of structural strength, thermal conduction and thermal contraction properties required to effectively support the loads of, and interface with, the supported cryogen vessel 22, the floor mounting 34, and thermal radiation shield 26.

The cryogen vessel support arrangement of FIG. 2 may be assembled in a particularly advantageous assembly process according to an aspect of the present invention, whereby an assembly of magnet coils 24 and cryogen vessel 22 with re-entrant section 36 is first positioned on the tubular support element 30 such that tubular support element 30 is at least partially accommodated within re-entrant section 36. The radiation shield 26 is preferably manufactured from a number of parts which are assembled around the tubular support element 30 and attached to it. Finally, the OVC 28 can be manufactured and installed in a similar manner. Accurate alignment of the vessels 22, 28 and thermal shield 26 is achieved by suitable features on the vessels, the shield and the tubular support element 30. No pre-loading or other adjustment is required. The OVC 28 may be attached to a flange similar to the flange interface surface 38 provided for retaining the thermal shield 26, but positioned nearer the floor. In such an assembly method, the tubular support element 30 must be closed by at least one closure surface 39, which effectively becomes part of the OVC when the remaining parts of the OVC are assembled around the tubular support element 30. Another closure surface may be provided, at about the height of the flange 38, to become part of the thermal radiation shield 26 when the parts of the thermal radiation shield 26 are assembled around the tubular support element 30.

Figure 3:
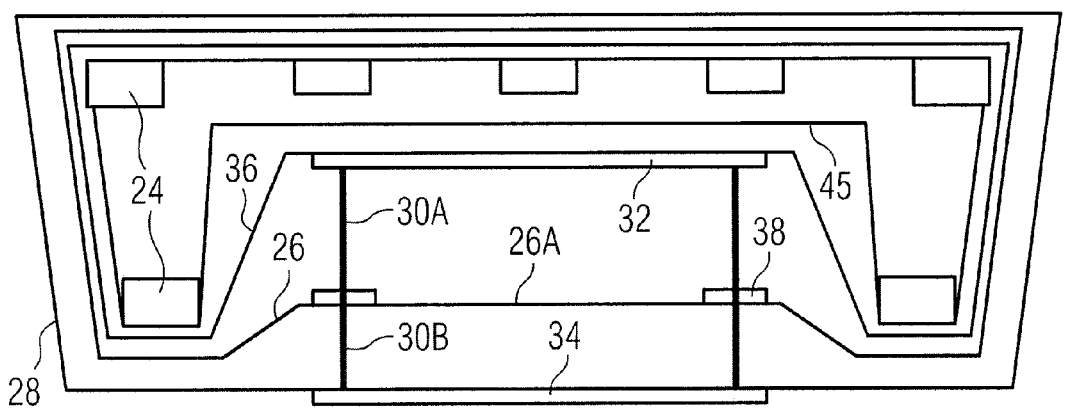
FIG. 3 shows an enlarged portion of the embodiment of FIG. 2.

FIG. 3 shows an enlarged part of FIG. 2, illustrating the tubular support element 30, the re-entrant portion 36, flange 38 and associated features in more detail. In order to provide complete thermal radiation shielding, the thermal radiation shield 26 is continued across the inside of the tubular support element 30A, 30B by a closure surface, hereafter referred to as shield portion 26A. Shield portion 26A is preferably attached to the tubular support element 30 by an interior extension of the flange 38.

Similarly, in order to provide a complete OVC, the OVC 28 is continued across the inside of the tubular suspension element 30A, 30B by a closure surface, hereafter referred to as OVC portion 34. OVC portion 34 may be attached to the tubular support element 30 by an interior extension of a flange connected to the remainder of the OVC. Alternatively, more simply, and as shown in FIG. 3, the OVC portion 34 may be a continuous plate, forming the flange for the remainder of the OVC.

Refinement of the tubular support element is possible by dividing it into two sections, for example having a lower section 30B placed between the OVC 28 and the thermal radiation shield 26 an upper section 30A placed between the thermal radiation shield 26 and the cryogen vessel 22. This facilitates the use of different composite materials and constructions for each section. For example, materials may be selected whose thermal conductivities are optimised for the temperature range to be encountered by each section when in use. That is, at cryogenic temperatures for the upper section 30A, and for higher temperatures for the lower section 30B. Further refinement may be achieved by selecting the material according to the mechanical load which must be supported by each section. The lower section 30B must support a somewhat higher mechanical load then the upper section 30A, since the lower section must support the weight of the thermal radiation shield in addition to the load supported by the upper section. For example, appropriate thermal conductivity at each temperature may be achieved by using carbon fibre for upper section 30A, with glass fibres for lower section 30B, giving relatively low thermal conductivity at the temperatures of each vessel. The material should be provided of sufficient thickness, fibre orientation and other known parameters of such materials to ensure that the tubular support element is mechanically sufficiently strong enough to support and retain the applied loads.

According to an aspect of the present invention, a single support 30 is provided, which has sufficient mechanical strength to retain the mass of the supported load, to forces equivalent to an acceleration of several G.

In a preferred embodiment of the invention, the thermal radiation shield mounting flange 38 is continuous between outer and inner surfaces of the tubular support element, with the separate sections 30A, 30B being assembled to the flange to form a single tubular support element 30. The shield portion 26A which is preferably provided within the tubular support element serves also to strengthen the tubular support element against buckling. Thermal radiation shield 26 may be "heat stationed"—cooled to an intermediate, cryogenic temperature, typically in the range of 70-90 K—by active refrigeration. By providing flange 38 of a relatively conductive material such as aluminium or steel, the shield portion 26A may be cooled to the same temperature as the remainder of the shield.

In alternative embodiments, the tubular support element may be a continuous tube of composite material with flange 38 adhesively bonded to its surface. A similar flange may be adhesively bonded to the interior surface of the tubular support element. In such embodiments, alternative provision may need to be made for thermally linking the shield portion 26A to the remainder of the thermal radiation shield, for example by way of a flexible copper braid link through a hole in one or other section 30A, 30B of the tubular support element.

Figure 4:
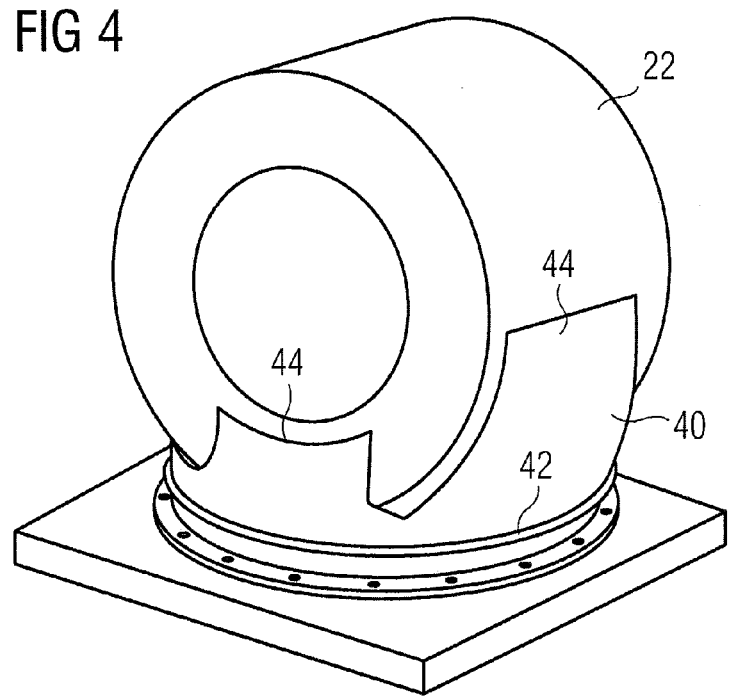
FIG. 4 shows a suspension system according to another embodiment of the present invention.

Alternative arrangements of the support are possible to suit different magnet configurations. FIG. 4 shows an embodiment of the invention which does not include a re-entrant section in the cryogen vessel 22. In the arrangement of FIG. 4, a single support element 40 is arranged about a generally vertical axis, generally perpendicular to a generally horizontal axis of cryogen vessel 22.

The support element 40 is preferably not simply cylindrical, but is shaped to suit the available space and support the cryogen vessel 22 against translation and rotation, and to cradle, support and retain the cryogen vessel through interface surfaces comprising the outer surface of the cryogen vessel and suitably shaped portions of support 40. The support 40 must of course be sufficiently strong to support and retain the cryogen vessel 22 and its contents through the whole range of foreseen mechanical loads including forces equivalent to acceleration of several G. Certain regions, such as at 42, of the support may be required to support a relatively large portion of the weight of the cryogen vessel and its contents. Certain other regions, such as at 44, of the support may be required to support lower static loads, but should match the thermal contraction characteristics of the cryogen vessel to which it is attached and serve to retain the cryogen vessel against displacement or rotation. By the use of suitable composite materials, fibre orientations and thicknesses, the characteristics of the different sections of the support 40 can be optimised to fulfil these varying requirements. Compared to the arrangement of FIGS. 2 and 3, the arrangement of FIG. 4 allows a greater support element length to be achieved with consequent thermal performance advantages, and minimises the stresses on the cryogen vessel 22, which may be thin-walled.

It is intended that the cryogen vessel 22 will be securely bonded to the tubular support element 40 at all points of contact, to ensure that the support element retains the cryogen vessel against movement in all directions. In certain applications, it may be found sufficient that the cryogen vessel be cradled within the support element, retained in position by its own weight, and not bonded to the support element.

Figure 5:
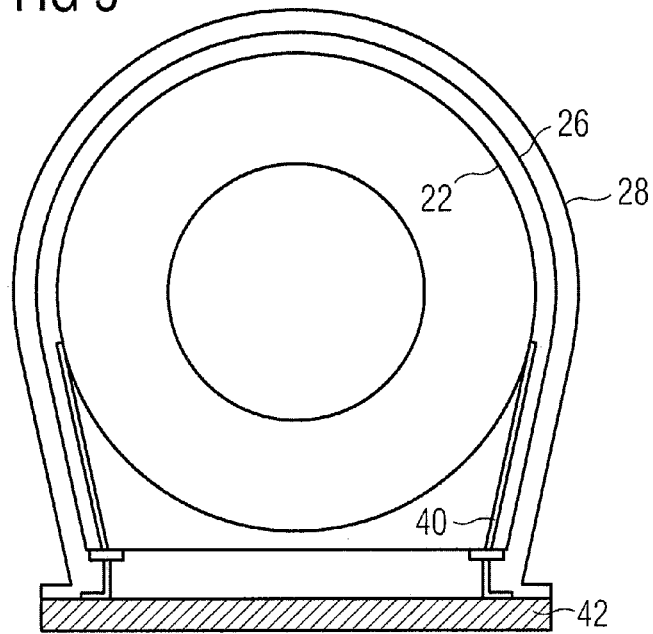
FIG. 5 illustrates a cross-section through the embodiment shown in FIG. 4.

FIG. 5 illustrates a cross-section through an embodiment of the invention such as shown in FIG. 4, within a complete cryostat arrangement comprising cryogen vessel 22 and support 40 of FIG. 4 within an OVC 28, having a thermal radiation shield 26 between the cryogen vessel 22 and the OVC 28, the shield being supported on the support 40. The support 40 may be constructed similarly to any of the described variations of the support 30 of FIG. 3, with upper and lower parts of the support optionally made of different materials, with a mounting flange supporting the thermal radiation shield, the flange optionally extending through the material of the tubular support. A shield portion is preferably provided within the support, to close the shield 26. This is believed to be more important in embodiments such as that of FIGS. 4, 5, since the support occupies a larger portion of the surface area of the thermal radiation shield than is the case in embodiments such as that shown in FIGS. 2, 3.

The support may be mounted on a base 42, which may also serve as a flange for the mounting of OVC 28. Preferably, base 42 becomes part of the OVC.

The thermal radiation shield 26 and OVC 28 may respectively be assembled as for the embodiment of FIGS. 2, 3. An assembly of magnet coils and cryogen vessel 22 is first positioned in/on the support 40. The thermal radiation shield 26 is preferably manufactured from a number of parts which are assembled around the support 40 and attached to it, preferably by way of a mounting flange 48. Finally, the OVC 28 is manufactured and installed in a similar manner. Accurate alignment of the vessels 22, 28 and thermal radiation shield 26 is achieved by suitable features on the vessels, the thermal radiation shield and the support 40. No pre-loading or other adjustment is required.

As illustrated in FIG. 5, it may be found convenient to produce the thermal radiation shield 26 and the OVC 28 in shapes other than the conventional cylinder shape, to better interface with the support 40. As also illustrated in FIG. 5, the support 40 may be tapered to better restrain the cryogen vessel.

In the arrangement of FIGS. 4 and 5, the support 40 retains the cryogen vessel 22 through complementary interface surfaces, comprising the outer surface of the cryogen vessel and a suitably shaped portion of the inner end surface of support 40.

Some cryogenically cooled equipment such as superconducting magnets are not housed within a cryogen vessel. They are directly cooled by a refrigerator, or by a cooling loop arrangement, well-known in the art. The present invention may be applied to such equipment, modified at follows. For embodiments such as shown in FIGS. 4, 5, the support 40 must be adapted to interface directly with the cooled equipment. Superconducting magnets are typically wound onto thermally conductive former, made of materials such as aluminium. The support 40 may be shaped to securely retain such former in directions of all expected force, against rotation and translation and to withstand forces equivalent to acceleration of several G. Care should be taken that the support does not bear against any sensitive parts of the cooled equipment, such as coils of a superconducting magnet.

Figure 6:
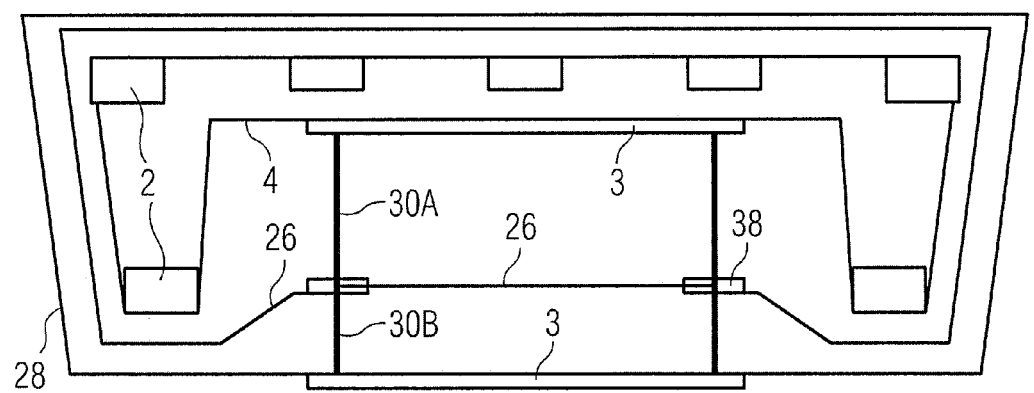
FIG. 6 shows a suspension system arrangement.

FIG. 6 shows a further arrangement, similar to that shown in FIGS. 2 and 3, adapted for cooled equipment such as a superconducting magnet wound as a number of coils on a former 45 which is not within a cryogen vessel. The tubular support element 30 (30A, 30B) is attached directly to a magnet coil support structure such as former 45. The absence of the cryogen vessel allows an increased length of tubular support element 30 with consequent thermal performance advantages. Other features and requirements of this arrangement are similar to those of the arrangement shown in FIG. 3.

The present invention accordingly provides a new support arrangement for superconducting magnet, wherein a single support is used in place of the multiple suspension elements used in conventional systems. The support element is arranged about a generally vertical axis, and supports a solenoidal magnet structure which is arranged about a generally horizontal axis.

Figure 1:
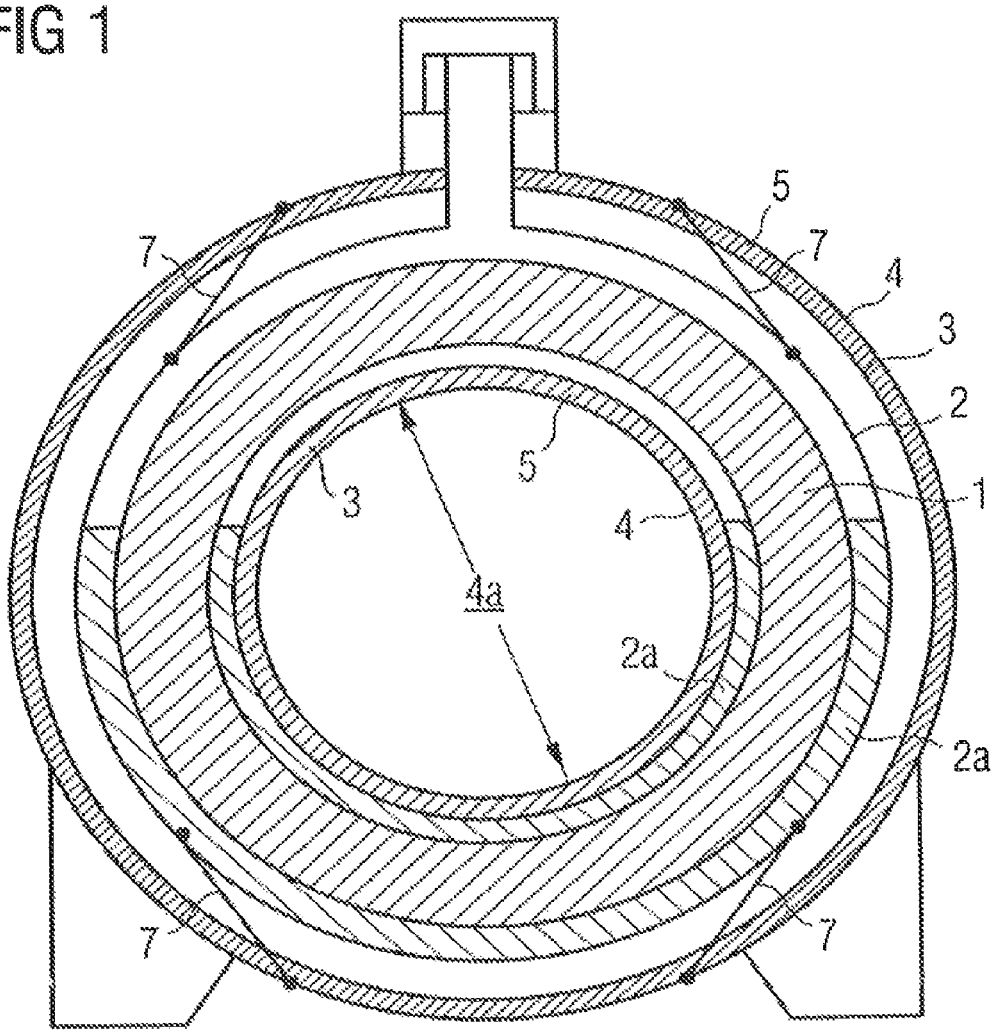
FIG. 1 shows a conventional arrangement of suspension elements for retaining a horizontally arranged solenoidal magnet in a cryogen vessel within an outer container.

The present invention provides at least the following advantages over the conventional support system described with reference to FIG. 1. The complexity and component parts count of the support arrangement is substantially reduced as compared to the support arrangement illustrated in FIG. 1. The support arrangement requires only a single connection to the outer vacuum container with consequent simplification of this structure and the assembly methods, since numerous suspension elements do not need to be installed and pre-tensioned. The overall assembly process is simplified, leading to simplification of high volume manufacture. In addition to these manufacturing advantages, the suspension arrangement of the present invention offers increased precision of alignment of the suspended vessels.

While the present invention has been described with reference to a limited number of particular embodiments, various modifications and variations of the present invention will be envisaged by those skilled in the art, within the scope of the present invention as defined by the appended claims.

The invention claimed is:

1. A supported superconducting magnet, comprising:
    a superconducting magnet (24) arranged within a generally tubular cryogen vessel (22), itself arranged within an outer vacuum container (OVC) (28); and
    a single generally tubular support element (30) bearing the weight of the superconducting magnet and the cryogen vessel against a support surface, located between the cryogen vessel and the support surface,
    the generally tubular support element being arranged about a generally vertical axis, and supporting a solenoidal magnet structure which is arranged about a generally horizontal axis,
    said generally tubular support element retains the cryogen vessel in a fixed relative position with reference to the outer vacuum container (22) wherein complementary interface surfaces are arranged to transmit the weight of the cryogen vessel and the superconducting magnet to the generally tubular support element,
    characterised in that a re-entrant portion (36) is provided in a wall of the cryogen vessel, and the generally tubular support element is at least partially accommodated within the re-entrant portion.

2. A supported superconducting magnet according to claim 1 wherein one of the complementary interface surfaces is provided by the re-entrant portion (36), and another of the complementary interface surfaces comprises an end of the generally tubular suspension element (30).

3. A supported superconducting magnet according to claim 2 wherein the cryogen vessel (22) has a horizontal axis and the generally tubular support element has a radial diameter less than that of the cryogen vessel.

4. A supported superconducting magnet according to claim 1, further comprising a radiation shield (26) located between the outer vacuum container and the cryogen vessel where provided, and between the outer vacuum container and the superconducting magnet where no cryogen vessel is provided, said radiation shield being supported on a shield support structure (38) comprising the support element (30; 40) between the shield and the support surface, said support element retaining the shield in a fixed relative position with reference to the outer vacuum container (22) by means of complementary interface surfaces (38) arranged to transmit the weight of the shield to the support structure.

5. A supported superconducting magnet according to claim 4 wherein the complementary interface surfaces comprise a flange (38) on the support element (30; 40).

6. A supported superconducting magnet according to claim 5 wherein the support element comprises an upper part (30B) and a lower part (30A), said upper and lower parts being joined at the flange (38).

7. A supported superconducting magnet according to claim 5 wherein the flange is continuous through a wall of the support element, providing a mounting flange on the inside of the a support element, which retains a shield portion (26A) in position within the support element.

8. A supported superconducting magnet according to claim 1 wherein the support element has a closure portion (34) across its lower end, providing a flange for mounting the OVC, said closure portion becoming a part of the OVC wall once the remainder of the OVC is assembled thereto.

9. A method of assembling a supported superconducting magnet (24) within an outer vacuum container (OVC) (28), such superconducting magnet being supported on a support surface, the method comprising the steps of:
    supporting the superconducting magnet on a support element (30; 40) located between the magnet and the support surface, said support element retaining the magnet in a fixed position with reference to the support surface by means of complementary interface surfaces arranged to transmit the weight of the superconducting magnet to the support structure;
    manufacturing the outer vacuum container in a plurality of parts, to be joined about the support element; and
    assembling the OVC around the support element (30) and attached to it,
    wherein the support element is arranged about a generally vertical axis, and supports a solenoidal magnet structure which is arrange about a generally horizontal axis.

10. A method of assembling a supported superconducting magnet (24) within an OVC (28) according to claim 9, wherein:
    the superconducting magnet is first assembled within a cryogen vessel (22);
    the cryogen vessel is supported on the support element (30; 40) located between the cryogen vessel and the support surface,
    said support element retaining the cryogen vessel in a fixed position with reference to the support surface by means of complementary interface surfaces arranged to transmit the weight of the superconducting magnet and the cryogen vessel to the support structure.

11. A method of assembling a supported superconducting magnet according to claim 9, further comprising, prior to the step of assembling the OVC, the steps of
    manufacturing a thermal radiation shield in a plurality of parts, to be joined about the support element; and
    assembling the thermal radiation shield around the support element (30; 40) and attached to it.

* * * * *